United States Patent
Arell et al.

(10) Patent No.: US 7,852,172 B2
(45) Date of Patent: Dec. 14, 2010

(54) HIGH-POWER SWITCH

(75) Inventors: Thomas William Arell, Basking Ridge, NJ (US); Henry Z Liwinski, North Wales, PA (US)

(73) Assignee: Anadigics Inc., Warren, NJ (US)

( * ) Notice: Subject to any disclaimer, the term of this patent is extended or adjusted under 35 U.S.C. 154(b) by 165 days.

(21) Appl. No.: 12/218,912

(22) Filed: Jul. 18, 2008

(65) Prior Publication Data

US 2010/0013571 A1 Jan. 21, 2010

(51) Int. Cl.
*H01P 1/10* (2006.01)
*H01P 1/15* (2006.01)

(52) U.S. Cl. ...................... 333/101; 333/103

(58) Field of Classification Search .............. 333/101, 333/103, 262
See application file for complete search history.

(56) References Cited

U.S. PATENT DOCUMENTS 4,920,285 A * 4/1990 Clark et al. ............... 327/435
6,642,578 B1 11/2003 Arnold et al.

* cited by examiner

*Primary Examiner*—Dean O Takaoka
(74) *Attorney, Agent, or Firm*—William L. Botjer

(57) ABSTRACT

A low-loss Radio Frequency (RF) switch for high-power RF signals. The RF switch includes a first-biasing circuit connected to a first transistor and a second-biasing circuit connected to a second transistor. The RF switch switches its output signal between a first input signal and a second input signal. The first transistor is in a conduction state and the second transistor is in a non-conduction state when the first input signal is to be conducted to the output signal. The first-biasing circuit biases the first transistor at a first voltage for increasing conduction of the first input signal and the second-biasing circuit biases the second transistor at a second voltage for decreasing conduction of the first input signal. Moreover, the second transistor is in a conduction state and the first transistor is in a non-conduction state when the second input signal is to be conducted to the output signal.

21 Claims, 3 Drawing Sheets

HIGH-POWER SWITCH

BACKGROUND

The present invention relates to Radio Frequency (RF) switches. More specifically, it relates to switching operations of low-loss transistor-based RF switches for high-power RF signals.

RF switches are used to switch between various input signals received by an RF switching circuit and provide the required input signal as its output signal. Further, RF switches may be connected in a series or in a parallel configuration with other circuit elements of the RF switching circuit. RF switches are generally implemented using transistors such as Bipolar Junction Transistors (BJTs), Field Effect Transistors (FETs) and the like. Examples of FETs include Junction Field Effect Transistors (JFETs), Metal Oxide Semiconductor Field Effect Transistors (MOSFETs), Metal Semiconductor Field Effect transistors (MESFETs), pseudomorphic High Electron Mobility Transistors (pHEMTs) and the like. Further, FETs may operate in an enhancement mode or a depletion mode and they may be implemented using n-channel or p-channel semiconductors.

The operation of an FET is controlled using a gate-to-source voltage ($V_{gs}$) a drain-to-source voltage ($V_{ds}$) and a threshold voltage ($V_{th}$). In an n-channel depletion-mode FET, the $V_{th}$ is the voltage at which the n-channel is pinched-off, i.e. the n-channel is depleted of charge carriers and the FET operates in a cut-off mode. In the cut-off mode, the source-to-drain current approaches zero and the FET functions in an off-state. However, when the n-channel is not pinched-off, the FET operates in a triode (linear) mode. In the triode mode, the source-to-drain current is controlled by $V_{ds}$ and the FET functions in an on-state.

RF switches are further classified based on the number of poles and the number of throws for example multi-throw RF switches include Single Pole Double Throw (SPDT) switches, Double Pole Double Throw (DPDT) switches and the like.

RF switches provide one of the received input signals at its output and are controlled using control voltages. Therefore, in an RF switch, only the transistor coupled to the input signal is required to conduct while the remaining transistors are required to be switched-off. Further, the on-transistors may be required to conduct a high-power input RF signal. A high-power RF input signal is a signal for which the corresponding RF peak voltage is high enough to change state of the RF switch by modifying the control voltages. The high-power input RF signal is capable of overriding control voltages that are applied to the off-transistors for maintaining them in the off-state. Therefore, the high-power input RF signal may bias the off-transistors such that they are switched back to the on-state. Hence, an RF signal swing, from a positive excursion to a negative excursion or vice-versa, may switch on the off-transistors. This results in power losses and distortion in the output of the RF switch. Further, resistance of the on-transistors results in conduction losses in the on-state. Therefore, distortion and losses, such as conduction losses and power losses, may occur in both the on-transistors and the off-transistors.

In light of the above, there is a need for a system that provides a bias voltage to the off-transistors for preventing the off-transistors from switching on from the off-state. Hence, the system should reduce the conduction capability of the off-transistors during the signal swing of a high-power input RF signal. Further, there is a need for a system that provides a bias voltage to the on-transistors for reducing their resistance in the on-state. The system should also preferably increase the conduction capability of the on-transistors. Moreover, the system should reduce power losses, conduction losses and distortion that may occur in an RF switch.

SUMMARY

An object of the present invention is to provide a low-loss Radio Frequency (RF) switch for high-power RF signals.

Another object of the present invention is to reduce the conduction capability of the off-transistors of the RF switch and prevent the off-transistors from switching on from the off-state.

Yet another object of the invention is to increase the conduction capability of the on-transistors of the RF switch and reduce their resistance in the on-state.

Still another object of the present invention is to reduce power losses, conduction losses and distortion in the RF switch.

In accordance with the objects of the invention, various embodiments of the invention provide a low-loss RF switch for high-power RF signals. The RF switch includes a first transistor and a second transistor. The first transistor receives a first input signal and the second transistor receives a second input signal. The RF switch provides an output signal based on conduction of either the first input signal by the first transistor or the second input signal by the second transistor. The RF switch includes a first-biasing circuit and a second-biasing circuit. The first-biasing circuit is connected to the first transistor and the second-biasing circuit is connected to the second transistor. When the first input signal is applied to the first transistor, the first-biasing circuit biases the first transistor at a first voltage for increasing its conduction of the first input signal. Further, the second-biasing circuit biases the second transistor at a second voltage for decreasing its conduction of the first input signal. Moreover, when the second input signal is required to be conducted at the output of the RF switch, the second transistor is in the on-state and the first transistor is in the off-state.

BRIEF DESCRIPTION OF THE DRAWINGS

Various embodiments of the invention will hereinafter be described in conjunction with the appended drawings, provided to illustrate and not to limit the invention, wherein like designations denote like elements, and in which.

DESCRIPTION OF VARIOUS EMBODIMENTS

Various embodiments of the invention provide a low-loss Radio Frequency (RF) switch for high-power RF signals. The low-loss RF switch is hereinafter referred to as an RF switch. The RF switch includes a first-biasing circuit and a second-biasing circuit. The first-biasing circuit provides a first-biasing voltage to an on-transistor of the RF switch for reducing the resistance of the on-transistor. The second-biasing circuit provides a second-biasing voltage to an off-transistor for ensuring that the off-transistor does not return to the on-state.

A high-power RF input signal is a signal for which the corresponding RF peak voltage is high enough to change state of the RF switch by modifying control voltages of the RF switch. For example, when a Metal Semiconductor Field Effect Transistor (MESFET) or a pseudomorphic High Electron Mobility Transistor (pHEMT) based RF switch function in the depletion mode, the RF peak voltage is dependent on the pinch-off voltage of the transistors of the RF switch. The pinch-off voltage typically varies between −1 to −2 volts and hence can be over-ridden by high-power RF signals. The RF peak voltage may also vary with the end-application of the RF switch. For example, in a mobile phone, an RF peak voltage of 50 mW and above, at 50 Ohm impedance level, is capable of switching the RF switch from an off-state to an on-state.

Figure 1:
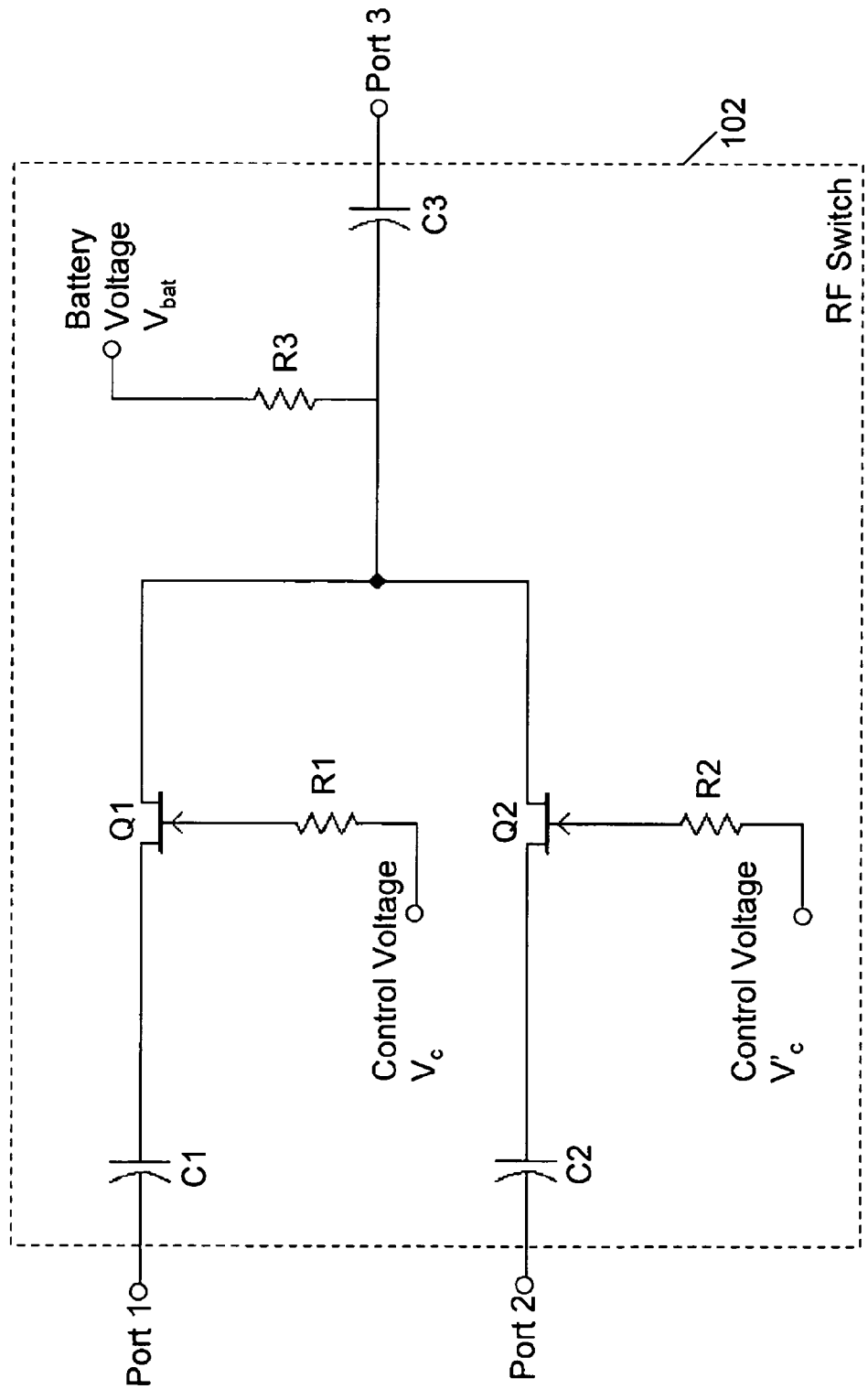
FIG. 1 is a schematic representation of a circuit diagram of a conventional Radio Frequency (RF) switch.

FIG. 1 is a schematic representation of a circuit diagram of a conventional RF switch 102. RF switch 102 includes capacitors C1, C2 and C3, FETs Q1 and Q2, and resistors R1, R2 and R3.

An input RF signal $V_1$ is received at port 1 and is applied to the drain of FET Q1 through capacitor C1. A control voltage $V_c$ is applied to the gate of FET Q1 through resistor R1. Similarly, an input RF signal $V_2$ is received at port 2 and is applied to the drain of FET Q2 through capacitor C2. A control voltage $V'_c$ is applied to the gate of FET Q2 through resistor R2. The source terminals of FET Q1 and FET Q2 are connected to a common node, which is further connected to resistor R3 and capacitor C3 in parallel. The other end of resistor R3 is connected to a battery voltage $V_{bat}$ and that of capacitor C3 is connected to port 3. Port 3 provides an output RF signal $V_{out}$.

A Single Pole Double Throw (SPDT) switch is implemented by RF switch 102 by switching output RF signal $V_{out}$ between input RF signals $V_1$ and $V_2$. Input RF signal $V_1$ may have a higher RF power than input RF signal $V_2$. For example, the RF power of input RF signal $V_1$ may be ten decibel higher than that of input RF signal $V_2$. When input RF signal $V_1$ is required at port 3, a conducting path is created between port 1 and port 3. This conducting path is created by providing the control voltage $V_c$ such that FET Q1 is maintained in an on-state. For example, when control voltage $V_c$ is equal to battery voltage $V_{bat}$, FET Q1 switches on and conducts i.e. gate-to-source voltage ($V_{gs}$) of FET Q1 is approximately zero. However, FET Q1 offers some resistance in the on-state. Further, a non-conducting path is required between port 2 and port 3. The non-conducting path is created by providing control voltage $V'_c$ such that FET Q2 is maintained in an off-state. For example, when control voltage $V'_c$ is less than a threshold voltage $V_{th}$, FET Q2 is switched off.

Further, voltages of opposite polarities are applied as control voltages $V_c$ and $V'_c$. Moreover, control voltages $V_c$ and $V'_c$ are generated using battery connections or logic circuits such as decoders and may be controlled by an end-user. Control voltage $V'_c$ is not sufficient to prevent FET Q2 from returning to the on-state. A large value of input RF signal V1 may hence return FET Q2 to the on-state which leads to power losses and distortion in RF switch 102.

Similarly, input RF signal $V_2$ may be required at port 3. In such a case, a conducting path is created between port 2 and port 3. Further, a non-conducting path is created between port 1 and port 3.

Examples of FETs Q1 and Q2 include Metal Semiconductor Field Effect Transistors (MESFETs) and pseudomorphic High Electron Mobility Transistors (pHEMTs). FETs Q1 and Q2 may function in an enhancement mode or a depletion mode. Further, FETs Q1 and Q2 may be n-channel or p-channel transistors.

Examples of RF switch 102 include multi-throw switches such as a Single Pole Double Throw (SPDT) switch and a Double Pole Double Throw (DPDT) switch.

Figure 2:
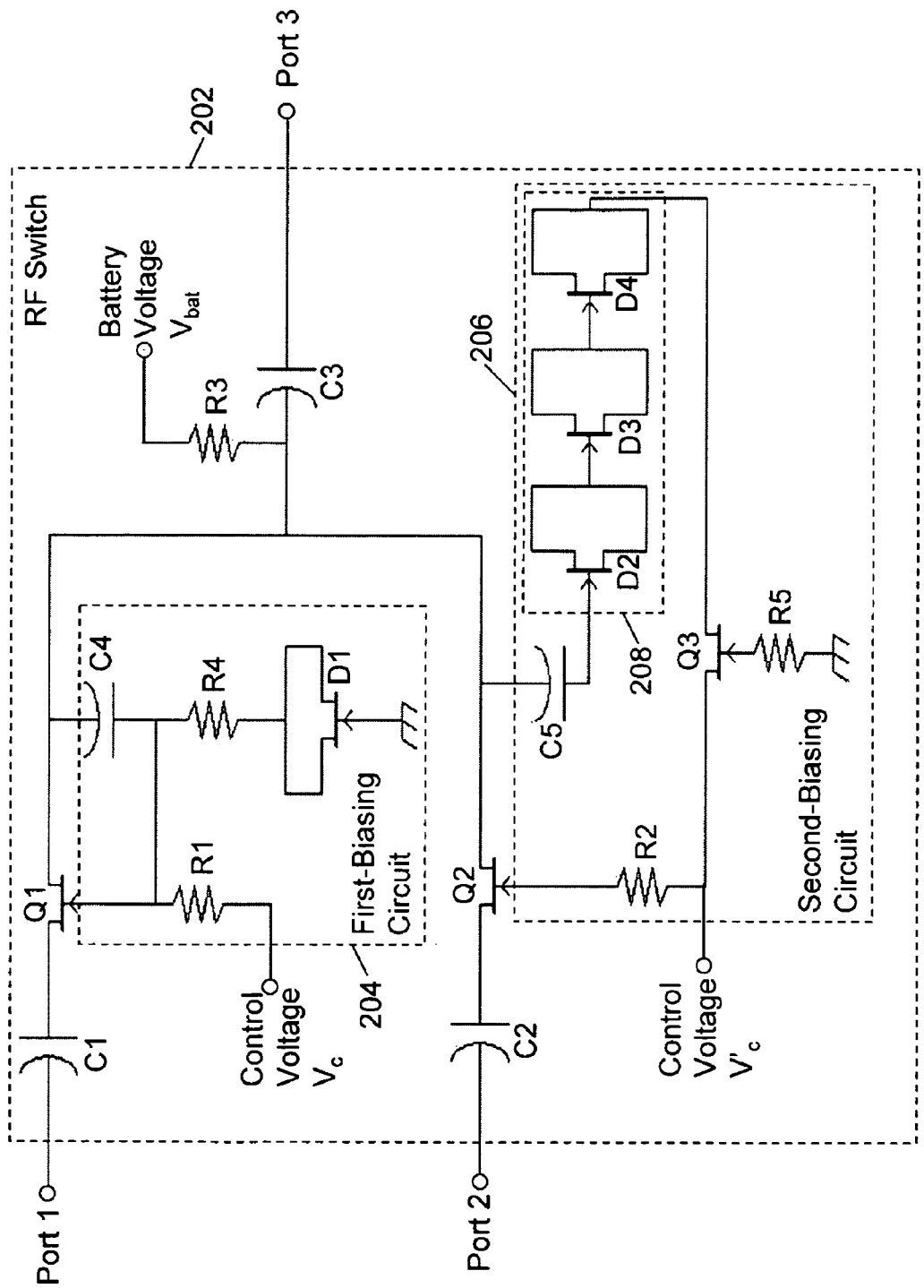
FIG. 2 is a schematic representation of a circuit diagram of an RF switch, in accordance with an embodiment of the invention.

FIG. 2 is a schematic representation of a circuit diagram of an RF switch 202, in accordance with an embodiment of the invention. RF switch 202 includes capacitors C1, C2 and C3, FETs Q1 and Q2, a first-biasing circuit 204, a second-biasing circuit 206 and resistor R3. First-biasing circuit 204 includes resistors R1 and R4, a capacitor C4 and a diode detector D1. Second-biasing circuit 206 includes resistors R2 and R5, a capacitor C5, a FET Q3 and a series-diode detector 208, which includes diode detectors D2, D3 and D4 connected in series. Diode detectors D1, D2, D3 and D4 are hereinafter referred to as diodes D1, D2, D3 and D4.

An input RF signal $V_1$ is received at port 1 and is applied to the drain of FET Q1 through capacitor C1. The source of FET Q1 is connected to one end of capacitor C4. The other end of capacitor C4 is connected to resistor R4 which is connected to ground through diode D1. One end of resistor R1 is connected to the gate terminal of FET Q1. The common node of capacitor C4 and resistor R4 is connected to the common node of resistor R1 and the gate terminal of FET Q1. The other end of resistor R1 is connected to a control voltage $V_c$. Hence, as discussed above, FET Q1 is connected to first-biasing circuit 204.

Further, an input RF signal $V_2$ is received at port 2 and is applied to the drain of FET Q2 through capacitor C2. The gate of FET Q2 is connected to one end of resistor R2. The source of FET Q2 is connected to one end of capacitor C5. The other end of capacitor C5 is connected to the anode of series-diode detector 208. The cathode of series-diode detector 208 is connected to the source terminal of FET Q3. The gate terminal of FET Q3 is connected to ground through resistor R5. The drain terminal of FET Q3 is connected to the other end of resistor R2. A control voltage $V'_c$ is applied to the common node of resistor R2 and the drain terminal of FET Q3. Hence, as discussed above, FET Q2 is connected to second-biasing circuit 206.

The source terminals of FETs Q1 and Q2 are also connected to a common node. The common node is further connected to resistor R3 and capacitor C3. The other end of resistor R3 is connected to a battery voltage $V_{bat}$. The other end of capacitor C3 is connected to port 3. Port 3 provides an output RF signal $V_{out}$.

In an embodiment of the invention, an SPDT switch is implemented by RF switch 202 by switching output RF signal $V_{out}$ between input RF signals $V_1$ and $V_2$.

When input RF signal $V_1$ is applied at port 3, a conducting path is required between port 1 and port 3 and a non-conducting path is required between port 2 and port 3.

The conducting path, between port 1 and port 3, is created by providing control voltage $V_c$ such that FET Q1 is maintained in an on-state. For example, when control voltage $V_c$ is equal to battery voltage $V_{bat}$, FET Q1 switches on and conducts i.e. gate-to-source voltage ($V_{gs}$) of FET Q1 is approximately zero. Input RF signal $V_1$ is coupled into first-biasing circuit 204 through capacitor C4. As a result of this, a first bias voltage, which is a positive voltage, corresponding to input RF signal $V_1$ is available at the gate of FET Q1. Hence, first-biasing circuit 204 converts input RF signal $V_1$ to a positive first bias voltage using resistors R1 and R4, capacitor C4 and diode D1. Therefore, first-biasing circuit 204 functions as a positive half-wave rectifier by providing the first bias voltage at the gate of FET Q1. The first bias voltage increases the voltage at the gate terminal of FET Q1 above $V_{bat}$ thereby increasing $V_{gs}$. For example, $V_{gs}$ may increase to 0.5 volts. Hence, FET Q1 operates in an 'open-channel' mode and the resistance offered by FET Q1 is reduced. Consequently, the conduction capability of FET Q1 is increased and conduction losses are reduced. Additionally, capacitor C4 functions as a smoothing capacitor and reduces ripple in the first bias voltage.

The non-conducting path, between port 2 and port 3, is created by providing control voltage $V'_c$ such that FET Q2 is maintained in an off-state. For example, when control voltage $V'_c$ is less than a threshold voltage $V_{th}$, FET Q2 is switched off. Further, capacitor C5 couples input RF signal $V_1$ into second-biasing circuit 206. As a result, series-diode detector 208 is forward biased and hence conducts. Consequently, voltage drops appear across diodes D2, D3 and D4. These voltage drops provide a second bias voltage, which is a negative voltage, at the gate of FET Q2. For example, a second bias voltage of −9 volts is provided. Hence, second-biasing circuit 206 converts input RF signal $V_1$ to a negative second bias voltage using resistors R2 and R5, capacitor C5, FET Q3 and series diode-detector 208. Therefore, second-biasing circuit 206 functions as a negative half-wave rectifier by providing the second bias voltage at the gate of FET Q2. The second bias voltage ensures that FET Q2 remains switched off and does not return to the on-state. Hence, the conduction capability of FET Q2 is reduced. This reduces power losses and distortion in RF switch 202. Additionally, capacitor C5 functions as a smoothing capacitor and reduces ripple in the second bias voltage. Further, FET Q3 is used to facilitate the conduction of series-diode detector 208.

Further, voltages of opposite polarities are applied as control voltages $V_c$ and $V'_c$. Moreover, control voltages $V_c$ and $V'_c$ are generated using battery connections or logic circuits such as decoders and may be controlled by an end-user.

Similarly, when input RF signal $V_2$ is required to be conducted, a conducting path is created between port 2 and port 3 and a non-conducting path is created between port 1 and port 3.

RF switch 202 is used when input RF signal $V_1$ has a higher RF power than input RF signal $V_2$. For example, the RF power of input RF signal $V_1$ may be ten decibel higher than that of input RF signal $V_2$. Hence, RF switch 202 is an asymmetrical RF switch. When input RF signal $V_1$ and input RF signal $V_2$ are of the same RF power, a symmetrical RF switch is required. A symmetrical RF switch is described in detail in conjunction with FIG. 3.

In an embodiment of the invention, diodes D1, D2, D3 and D4 are conventional PN junction diodes. In another embodiment of the invention, diodes D1, D2, D3 and D4 are diode-connected Bipolar Junction Transistors (BJTs) such as Hetero-junction Bipolar Transistor (HBTs). Further, diodes D1, D2, D3, and D4 may be implemented using n-channel FETs or p-channel FETs with their drain and source terminals connected together. Series-diode detector 208 may include one or more diodes such as diodes D1, D2, D3 and D4. The number of diodes in series-diode detector 208 is chosen based on impedance and power considerations. Further, the second bias voltage increases with the increase in number of diodes included in series-diode detector 208.

Examples of FETs Q1 and Q2 include MESFETs and pHEMTs. FETs Q1 and Q2 may function in an enhancement mode or a depletion mode. Further, FETs Q1 and Q2 may be n-channel or p-channel transistors.

Examples of RF switch 202 include multi-throw switches such as an SPDT switch and a DPDT switch.

In an embodiment of the invention, second biasing circuit 206 does not include FET Q3 and resistor R5.

In an embodiment of the invention, RF switch 202 is used in the path of a high-power amplifier.

Figure 3:
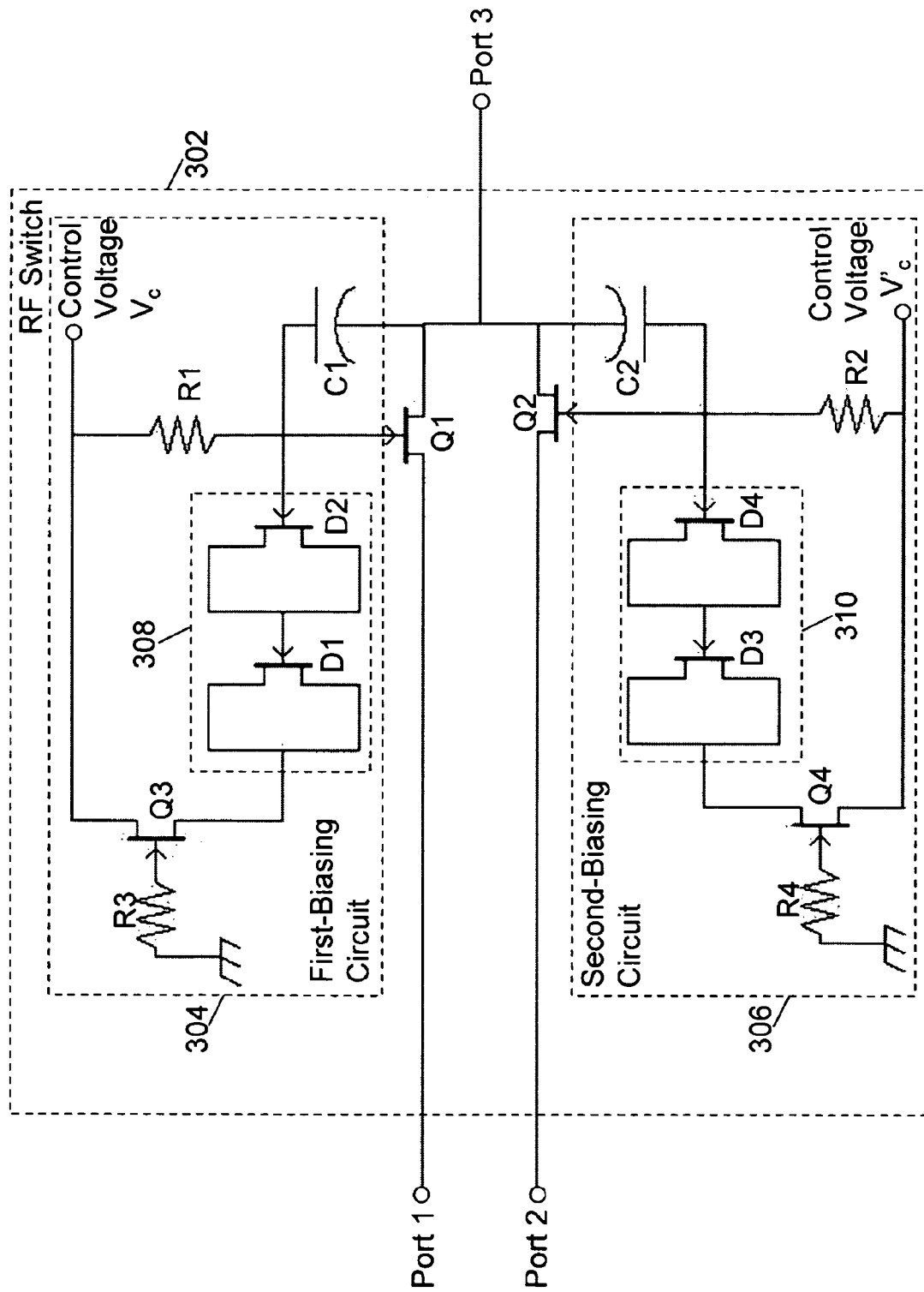
FIG. 3 is a schematic representation of a circuit diagram of an RF switch, in accordance with another embodiment of the invention.

FIG. 3 is a schematic representation of a circuit diagram of an RF switch 302, in accordance with another embodiment of the invention. RF switch 302 includes FETs Q1 and Q2, a first-biasing circuit 304, a second-biasing circuit 306. First-biasing circuit 304 includes resistors R1 and R3, a capacitor C1, a FET Q3 and a series-diode detector 308. Second-biasing circuit 306 includes resistors R2 and R4, a capacitor C2, a FET Q4 and a series-diode detector 310. Series-diode detector 308 includes diode detectors D1 and D2 connected in series and series-diode detector 310 includes diode detectors D3 and D4 connected in series. Diode detectors D1, D2, D3 and D4 are hereinafter referred to as diodes D1, D2, D3 and D4.

An input RF signal $V_1$ is received at port 1 and is applied to the drain terminal of FET Q1. The gate terminal of FET Q1 is connected to the common node of resistor R1 and the anode of series-diode detector 308. The cathode of series-diode detector 308 is connected to the source terminal of FET Q3. The gate terminal of FET Q3 is connected to ground through resistor R3. The drain terminal of FET Q3 is connected to the other end of resistor R1. A control voltage $V_c$ is applied to the common node of resistor R1 and the drain terminal of FET Q3. The common node of resistor R1 and the anode of series-diode detector 308 is connected to capacitor C1. The other end of capacitor C1 is connected to the source terminal of FET Q1 which is also connected to port 3. Port 3 provides an output RF signal $V_{out}$. Hence, as discussed above, FET Q1 is connected to first-biasing circuit 304.

An input RF signal $V_2$ is received at port 2 and is applied at the drain terminal of FET Q2. The gate terminal of FET Q2 is connected to the common node of resistor R2 and the anode of series-diode detector 310. The cathode of series-diode detector 310 is connected to the source terminal of FET Q4. The gate terminal of FET Q4 is connected to ground through resistor R4. The drain terminal of FET Q4 is connected to the other end of resistor R2. A control voltage $V'_c$ is applied to the common node of resistor R2 and the drain terminal of FET Q4. The common node of resistor R2 and the anode of series-diode detector 310 is connected to capacitor C2. The other end of capacitor C2 is connected to the source terminal of FET Q2 which is also connected to port 3. Port 3 provides an output RF signal $V_{out}$. Hence, as discussed above, FET Q2 is connected to first-biasing circuit 306.

In an embodiment of the invention, an SPDT switch is implemented by RF switch 302 by switching output RF signal $V_{out}$ between input RF signals $V_1$ and $V_2$. RF switch 302 is a symmetrical RF switch and hence, first-biasing circuit 304 and second-biasing circuit 306 function even for input RF signals of the same RF power. For example, RF switch 302 is used when input RF signal $V_1$ and input RF signal $V_2$ have same RF power.

When input RF signal $V_1$ is required at port 3, a conducting path is required between port 1 and port 3 and a non-conducting path is required between port 2 and port 3.

The conducting path is created, between port 1 and port 3, by providing control voltage $V_c$ such that FET Q1 is maintained in an on-state. For example, when control voltage $V_c$ is equal to battery voltage $V_{bat}$, FET Q1 switches on and conducts i.e. gate-to-source voltage ($V_{gs}$) of FET Q1 is approximately zero. Input RF signal $V_1$ is coupled into first-biasing circuit 304 through capacitor C1. The drain terminal of FET Q3 is connected to control voltage $V_c$ and the gate terminal of FET Q3 is connected to ground. Hence, FET Q3 is switched off. This reverse biases series-diode detector 308. Hence, series-diode detector 308 and FET Q3 are disabled. Hence, the input RF signal is conducted from port 1 to port 3 through FET Q1.

The non-conducting path is created, between port 2 and port 3, by providing control voltage $V'_c$ such that FET Q2 is maintained in an off-state. For example, when control voltage $V'_c$ is less than a threshold voltage $V_{th}$, FET Q2 is switched off. Further, capacitor C2 couples input RF signal $V_1$ into second-biasing circuit 306. The drain terminal of FET Q4 is connected to control voltage $V'_c$ and the gate terminal of FET Q4 is connected to ground. Hence, FET Q4 is forward biased and is switched on. This forward biases series-diode detector 310. Hence, series-diode detector 310 and FET Q4 are enabled and hence, voltage drops appear across diodes D3 and D4. These voltage drops provide a second bias voltage, which is a negative voltage, at the gate of FET Q2. For example, a second bias voltage of −9 volts is provided. Therefore, second-biasing circuit 306 functions as a negative half-wave rectifier by providing the second bias voltage at the gate of FET Q2. The second bias voltage ensures that FET Q2 remains switched off and does not return to the on-state. Hence, the conduction capability of FET Q2 is reduced. This reduces power losses and distortion in RF switch 302. Additionally, capacitor C2 functions as a smoothing capacitor and reduces ripple in the second bias voltage. Further, FET Q4 is used to facilitate the conduction of series-diode detector 310.

Further, voltages of opposite polarities are applied as control voltages $V_c$ and $V'_c$. Moreover, control voltages $V_c$ and $V'_c$ are generated using battery connections or logic circuits such as decoders and may be controlled by an end-user.

Similarly, input RF signal $V_2$ may be required at port 3. In such a case, a conducting path is created between port 2 and port 3 and a non-conducting path is created between port 1 and port 3. In this case, first-biasing circuit 304 functions as a negative half-wave rectifier.

In an embodiment of the invention, diodes D1, D2, D3 and D4 are conventional PN junction diodes. In another embodiment of the invention, diodes D1, D2, D3 and D4 are diode-connected BJTs, such as HBTs. Further, diodes D1, D2, D3, and D4 may be implemented using n-channel FETs or p-channel FETs with their drain and source terminals connected together. Series-diode detectors 308 and 310 may include one or more diodes such as diodes D1, D2, D3 and D4. The number of diodes in series-diode detectors 308 and 310 is chosen based on impedance and power considerations. Further, the second bias voltage increases with the increase in number of diodes included in series-diode detectors 308 and 310.

Examples of FETs Q1 and Q2 include MESFETs and pHEMTs. FETs Q1 and Q2 may function in an enhancement mode or a depletion mode. Further, FETs Q1 and Q2 may be n-channel or p-channel transistors.

Examples of RF switch 302 include multi-throw switches such as an SPDT switch and a DPDT switch.

In an embodiment of the invention, first biasing circuit 304 does not include FET Q3 and resistor R3. Similarly, second biasing circuit 310 may not include FET Q4 and resistor R4.

In an embodiment of the invention, RF switch 302 is used in the path of a high-power amplifier.

Various embodiments of the invention provide a number of advantages. The system provides a bias voltage to the off-transistors for preventing the off-transistors from switching on from the off-state. Hence, the system reduces the conduction capability of the off-transistors during the signal swing of a high-power input RF signal. Further, the system provides a bias voltage to the on-transistors for reducing their resistance in the on-state. The system increases the conduction capability of the on-transistors. Moreover, the system reduces power losses, conduction losses and distortion that occur in an RF switch.

While the various embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A Radio Frequency (RF) switch, the RF switch comprising at least a first transistor and a second transistor, wherein the first transistor receives a first input signal and the second transistor receives a second input signal, the RF switch providing at least one output signal, the at least one output signal being based on conduction of one of the first input signal by the first transistor and conduction of the second input signal by the second transistor, the RF switch comprising:
   a. at least one first-biasing circuit, the at least one first-biasing circuit being connected to the first transistor, the at least one first-biasing circuit provides a first bias voltage at a gate terminal of the first transistor to increase conduction capability of the first transistor when the first transistor is in a conducting state and the second transistor is in a non-conducting state, wherein the at least one first-biasing circuit comprises:
      i. at least one of one or more first capacitors and one or more first resistors, wherein the one or more capacitors are connected to the first transistor and the one or more first resistors, the one or more first capacitors coupling the first input signal with the at least one first-biasing circuit; and
      ii. one or more first diode detectors; and
   b. at least one second-biasing circuit, the at least one second-biasing circuit being connected to the second transistor, the at least one second-biasing circuit provides a second bias voltage at a gate terminal of the second transistor to decrease conduction capability of the second transistor when the first transistor is in the conducting state and the second transistor is in the non-conducting state, wherein the at least one second-biasing circuit comprises:
      i. at least one of one or more second capacitors, one or more second resistors and one or more transistors; and
      ii. one or more second diode detectors, wherein the one or more second diode detectors are connected in series as a series-diode detector, the series-diode detector being connected to the one or more transistors and the one or more second capacitors.

2. The RF switch of claim 1, wherein the at least one first-biasing circuit and the at least one second-biasing circuit is a half-wave rectifier circuit.

3. The RF switch of claim 1, wherein the one or more first capacitors reduces ripple in the first bias voltage.

4. The RF switch of claim 1, wherein the one or more first diode detectors are connected between the one or more first resistors and a ground voltage terminal.

5. The RF switch of claim 1, wherein the one or more first resistors are connected to the first transistor and the one or more first capacitors.

6. The RF switch of claim 1, wherein at least one of the one or more first resistors are connected to at least one of the one or more first diode detectors and a first control voltage.

7. The RF switch of claim 1, wherein the one or more second capacitors are connected to the second transistor and the one or more second diode detectors, the one or more second capacitors reducing ripple in the second bias voltage.

8. The RF switch of claim 1, wherein the one or more second capacitors are connected to the second transistor and the one or more second diode detectors, the one or more second capacitors coupling the first input signal with the at least one second-biasing circuit.

9. The RF switch of claim 1, wherein the one or more second resistors are connected to the second transistor, the one or more transistors and a second control voltage.

10. The RF switch of claim 9, wherein the one or more transistors are connected to the second control voltage, a ground voltage terminal, the one or more second resistors and the one or more second diode detectors.

11. A Radio Frequency (RF) switch, the RF switch comprising at least a first transistor and a second transistor, wherein an input signal to be conducted is applied to one of the first transistor and the second transistor, the RF switch providing at least one output signal, the at least one output signal being based on the conduction of the input signal, the RF switch comprising:
   a. at least one first-biasing circuit, the at least one first-biasing circuit being connected to the first transistor, the at least one first-biasing circuit provides a first bias voltage at a gate terminal of the first transistor to decrease conduction capability of the first transistor when the input signal is applied to the second transistor, wherein the at least one first-biasing circuit comprises:
      i. at least one of one or more capacitors, one or more resistors and one or more transistors, wherein the one or more capacitors are connected to the first transistor, the one or more resistors and the one or more diode detectors, the one or more capacitors coupling the input signal with the at least one first-biasing circuit; and
      ii. one or more diode detectors, wherein the one or more diode detectors are connected in series as a series-diode detector, the series-diode detector being connected to the one or more transistors, the one or more resistors, the one or more capacitors and the first transistor; and
   b. at least one second-biasing circuit, the at least one second-biasing circuit being connected to the second transistor, the at least one second-biasing circuit provides a second bias voltage at a gate terminal of the second transistor to decrease conduction capability of the second transistor when the input signal is applied to the first transistor.

12. The RF switch of claim 11, wherein the at least one first-biasing circuit and the at least one second-biasing circuit are symmetrical, the at least one first-biasing circuit and the at least one second-biasing circuit being half-wave rectifier circuits.

13. The RF switch of claim 11, wherein the one or more capacitors are connected to the first transistor, the one or more resistors and the one or more diode detectors, the one or more capacitors reducing ripple in the first bias voltage.

14. The RF switch of claim 11, wherein the one or more resistors are connected to the first transistor, the one or more diode detectors, the one or more capacitors, the one or more transistors and a first control voltage.

15. The RF switch of claim 14, wherein the one or more transistors are connected to the first control voltage, the one or more resistors, the one or more diode detectors and a ground voltage terminal.

16. A Radio Frequency (RF) switch, the RF switch comprising at least a first transistor and a second transistor, wherein an input signal to be conducted is applied to one of the first transistor and the second transistor, the RF switch providing an output signal, the output signal being based on conduction of the input signal by at least one of the first transistor and the second transistor, the RF switch comprising:
   a. at least one first-biasing circuit, the at least one first-biasing circuit being connected to the input signal and the first transistor, wherein the input signal is coupled to the at least one first-biasing circuit through a one or more capacitors, the at least one first-biasing circuit provides a first bias voltage at a gate terminal of the first transistor to increase conduction capability of the first transistor when the first transistor is in a conducting state and the second transistor is in a non-conducting state; and
   b. at least one second-biasing circuit, the at least one second-biasing circuit being connected to the second transistor, the at least one second-biasing circuit providing a second bias voltage at a gate terminal of the second transistor to decrease conduction capability of the second transistor when the first transistor is in the conducting state and the second transistor is in the non-conducting state, wherein the at least one second-biasing circuit comprises at least one third transistor, the at least one third transistor enables activation of the at least one second-biasing circuit.

17. The RF switch of claim 16, wherein the first bias voltage is a positive voltage and the second bias voltage is a negative voltage.

18. The RF switch of claim 16, wherein the at least one first-biasing circuit and the at least one second-biasing circuit is a half-wave rectifier circuit, the at least one first-biasing circuit and the at least one second-biasing circuit being integrated with the RF switch, whereby the impedance to a ground is increased and the insertion loss is minimized.

19. The RF switch of claim 16, wherein the one or more capacitors reduces ripple in the first bias voltage.

20. The RF switch of claim 16, wherein conduction of the first transistor is enabled by means of a first control voltage applied to the gate terminal of the first transistor.

21. The RF switch of claim 20, wherein conduction of the second transistor is disabled by means of a second control voltage applied to the gate terminal of the second transistor, the second control voltage having a polarity opposite to that of the first control voltage.

* * * * *